(12) United States Patent
Choi et al.

(10) Patent No.: US 9,812,670 B2
(45) Date of Patent: Nov. 7, 2017

(54) POLARIZATION FILM, ANTIREFLECTION FILM, AND DISPLAY DEVICE

(71) Applicant: SAMSUNG ELECTRONICS CO., LTD., Suwon-si (KR)

(72) Inventors: Hyun-Seok Choi, Anyang-si (KR); Sangah Gam, Seoul (KR); Seong-Jun Yoon, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 84 days.

(21) Appl. No.: 14/751,958

(22) Filed: Jun. 26, 2015

(65) Prior Publication Data
US 2015/0380689 A1 Dec. 31, 2015

(30) Foreign Application Priority Data
Jun. 27, 2014 (KR) .................. 10-2014-0080186

(51) Int. Cl.
| | | |
|---|---|---|
| *H01L 51/52* | (2006.01) | |
| *G02B 1/14* | (2015.01) | |
| *G02B 5/30* | (2006.01) | |
| *G02B 1/111* | (2015.01) | |
| *H01L 51/50* | (2006.01) | |

(Continued)

(52) U.S. Cl.
CPC .......... *H01L 51/5281* (2013.01); *G02B 1/111* (2013.01); *G02B 1/14* (2015.01); *G02B 5/305* (2013.01); *G02B 5/3033* (2013.01); *G02B 5/3083* (2013.01); *H01L 51/5012* (2013.01); *H01L 51/5256* (2013.01); *G02F 2001/133541* (2013.01); *H01L 51/004* (2013.01); *H01L 51/0035* (2013.01); *H01L 51/0036* (2013.01)

(58) Field of Classification Search
CPC ............ H01L 51/5281; H01L 51/5012; H01L 51/5256; H01L 51/0036; H01L 51/0035; H01L 51/004; G02B 5/3033; G02B 5/3083; G02B 1/14; G02B 5/305; G02B 1/111; G02B 2001/133541
See application file for complete search history.

(56) References Cited

U.S. PATENT DOCUMENTS

| | | |
|---|---|---|
| 8,343,628 B2 | 1/2013 | Fukuda et al. |
| 8,475,931 B2 | 7/2013 | Sugino et al. |

(Continued)

FOREIGN PATENT DOCUMENTS

| | | |
|---|---|---|
| EP | 2728388 | 5/2014 |
| JP | 2000249832 | 9/2000 |

(Continued)

OTHER PUBLICATIONS

European Search Report—European Patent Application No. 15173334.2 dated Nov. 2, 2015, citing the enumerated references listed within.

*Primary Examiner* — Donald Raleigh
*Assistant Examiner* — Kevin Quarterman
(74) *Attorney, Agent, or Firm* — Cantor Colburn LLP (57) ABSTRACT

A polarization film includes a polarization layer including a polymer and a dichroic dye having a maximum absorption wavelength ($\lambda_{max}$) at about 380 nm to about 780 nm, and a protective layer disposed on a surface of the polarization layer and having a cross-linking structure.

24 Claims, 6 Drawing Sheets

(51) Int. Cl.
*H01L 51/00* (2006.01)
*G02F 1/1335* (2006.01)

(56) References Cited

U.S. PATENT DOCUMENTS

| | | | |
|---|---|---|---|
| 8,591,644 B2 | 11/2013 | Onouchi et al. | |
| 2006/0013967 A1* | 1/2006 | Mikoshiba | G02F 1/13338 428/1.1 |
| 2009/0115935 A1* | 5/2009 | Maeda | G02F 1/133606 349/62 |
| 2009/0244446 A1* | 10/2009 | Yasuda | G02F 1/13363 349/96 |
| 2013/0160938 A1* | 6/2013 | Yasui | G02B 5/3025 156/246 |
| 2014/0124714 A1† | 5/2014 | Lee | |
| 2016/0254480 A1* | 9/2016 | Yang | H01L 51/5246 |
| 2016/0274274 A1* | 9/2016 | Yoo | C09B 35/021 |

FOREIGN PATENT DOCUMENTS

| | | |
|---|---|---|
| JP | 2003232919 A2 † | 8/2003 |
| JP | 2005010329 A2 † | 1/2005 |
| JP | 2006215174 | 8/2006 |
| JP | 2008058768 | 3/2008 |
| JP | 2008107432 | 5/2008 |
| JP | 2009204725 | 9/2009 |
| JP | 2009244860 | 10/2009 |
| JP | 2009251150 | 10/2009 |
| JP | 2011100059 | 5/2011 |
| JP | 2011221185 | 11/2011 |
| JP | 2013020111 | 1/2013 |
| JP | 2013037353 A2 † | 2/2013 |
| KR | 1020050087906 | 9/2005 |
| KR | 1020100007500 | 1/2010 |
| KR | 1020100046645 | 5/2010 |
| KR | 1020100090921 | 8/2010 |
| KR | 1020100129512 | 12/2010 |
| KR | 20110022559 A † | 3/2011 |
| KR | 1020110037622 | 4/2011 |
| KR | 1020110047596 | 5/2011 |
| KR | 1020120078019 | 7/2012 |
| KR | 1020130026268 | 3/2013 |
| WO | 2007052912 | 5/2007 |

\* cited by examiner
† cited by third party

POLARIZATION FILM, ANTIREFLECTION FILM, AND DISPLAY DEVICE

This application claims priority to Korean Patent Application No. 10-2014-0080186 filed on Jun. 27, 2014, and all the benefits accruing therefrom under 35 U.S.C. §119, the content of which in its entirety is herein incorporated by reference.

BACKGROUND

1. Field

The disclosure is directed to a polarization film, an antireflection film, and a display device.

2. Description of the Related Art

A display device such as a liquid crystal display ("LCD") and an organic light emitting diode ("OLED") device typically includes a polarizing plate attached to an outer surface of a display panel. The polarizing plate may only transmit light of a specific wavelength, and absorb or reflect light of other wavelengths, to control the direction of incident light into the display panel or light emitted from the display panel.

However, the polarizing plate may be manufactured using a complicated process with high production costs, and may increase a thickness of the polarizing plate, which leads to an increased thickness of a display device.

Accordingly, a polarization film that does not include a separate protecting plate has been researched. The polarization film having no separate protecting plate may be effectively used for a thin display device.

SUMMARY

A polarization film that does not include a separate protecting plate may be easily scratched on the surface due to low hardness of the polarization film. Optical properties of the polarization film may be deteriorated due to migration of a dichroic dye in the polarization film to another layer contacting therewith under a high temperature and high humidity environment.

One embodiment provides a polarization film including a protective layer having a cross-linking structure, in which degradation of optical properties thereof is effectively prevented by increasing hardness and migration of a dichroic dye in a polarization layer thereof is effectively prevented.

Another embodiment provides an antireflection film including the polarization film.

Yet another embodiment provides a display device including the polarization film or the antireflection film.

According to an embodiment, a polarization film includes a polarization layer including a polymer, and a dichroic dye having a maximum absorption wavelength ($\lambda_{max}$) at about 380 nanometers (nm) to about 780 nm and a protective layer disposed on a surface of the polarization layer and having a cross-linking structure.

In an embodiment, the cross-linking structure of the protective layer may block the dichroic dye from migrating outside of the polarization layer.

In an embodiment, the protective layer may include a material having the cross-linking structure obtained by curing a photocurable monomer, a photocurable oligomer, a thermosetting resin, or a combination thereof.

In an embodiment, the photocurable monomer or the photocurable oligomer may include a urethane acrylate monomer, a urethane acrylate oligomer, an epoxy acrylate monomer, an epoxy acrylate oligomer, a polyether acrylate monomer, a polyether acrylate oligomer, a polyester acrylate monomer, a polyester acrylate oligomer, or a combination thereof.

In an embodiment, the material having the cross-linking structure may be obtained from a composition including about 5 to about 60 weight percent (wt %) of the photocurable monomer or the photocurable oligomer, about 0.01 wt % to about 5 wt % of a photoinitiator, and a balance of a solvent.

In an embodiment, the thermosetting resin may include a melamine resin, a urethane resin, an epoxy resin, or a combination thereof.

In an embodiment, the material having the cross-linking structure may be obtained from a composition including about 15 wt % to about 74 wt % of the thermosetting resin, about 0.1 wt % to about 10 wt % of a curing agent, and a balance of a solvent.

In an embodiment, the polymer may include a polyolefin, a polyamide, a polyester, a polyacryl, polystyrene, a copolymer thereof, or a combination thereof.

In an embodiment, the polymer may include polyethylene ("PE"), polypropylene ("PP"), polyethylene terephthalate ("PET"), polyethylene terephthalate glycol ("PETG"), polyethylene naphthalate ("PEN"), nylon, a copolymer thereof, or a combination thereof.

In an embodiment, the polarization film may have a variation ratio of light transmittance ($\Delta T$) of less than or equal to about 0.5% when allowed to stand at about 80° C. for about 500 hours.

In an embodiment, the polarization film may have a variation ratio of a degree of polarization ($\Delta PE$) of less than or equal to about 3% when allowed to stand at about 80° C. for about 500 hours.

In an embodiment, the polarization film may have a variation ratio of a dichroic ratio ($\Delta DR$) of less than or equal to about 0.5 when allowed to stand at about 80° C. for about 500 hours.

In an embodiment, the protective layer may have a thickness of less than or equal to about 10 micrometers (µm).

In an embodiment, the protective layer may have a thickness of about 0.1 µm to about 5 µm.

In an embodiment, the polarization layer may include a melt-blend of the polymer and the dichroic dye.

In an embodiment, the dichroic dye may be dispersed in the polymer, and the polymer may be elongated at about 400% to about 1000% in a uniaxial direction.

According to another embodiment, an antireflection film includes the polarization film and a phase difference film disposed on a surface of the polarization film.

According to yet another embodiment, a display device includes the polarization film or the antireflection film.

BRIEF DESCRIPTION OF THE DRAWINGS

These and/or other features of the invention will become apparent and more readily appreciated from the following detailed description of embodiments thereof, taken in conjunction with the accompanying drawings, in which.

DETAILED DESCRIPTION

The embodiments will be described more fully hereinafter with reference to the accompanying drawings. As those skilled in the art would realize, the described embodiments may be modified in various different ways, all without departing from the spirit or scope of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example In an exemplary embodiment, if when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, embodiments of a polarization film according to one embodiment will be described in detail referring to FIGS. 1 and 2.

Figure 1:
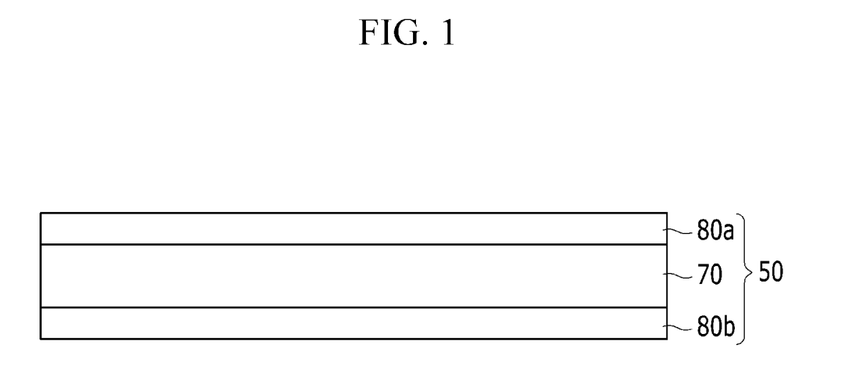
FIG. 1 is a schematic cross-sectional view showing an embodiment of a polarization film according to one embodiment.
Figure 2:
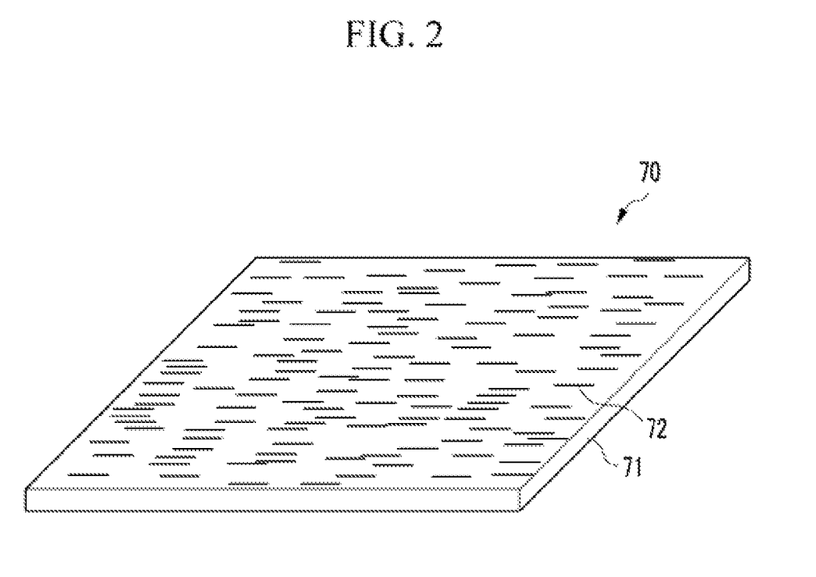
FIG. 2 is a schematic view showing an embodiment of a polarization layer of the polarization film in FIG. 1.

FIG. 1 is a schematic cross-sectional view of an embodiment of a polarization film according to one embodiment, and FIG. 2 is a schematic view of an embodiment of a polarization layer of the polarization film in FIG. 1.

Referring to FIG. 1, an embodiment of a polarization film 50 includes a polarization layer 70 and a protective layer, e.g., a plurality of protective layers 80a and 80b.

First, referring to FIG. 2, the polarization layer 70 will be described in detail.

In an embodiment, the polarization layer 70 includes a polymer 71 and a dichroic dye 72 disposed, e.g., dispersed, in the polymer 71.

In an embodiment, the polymer 71 may include a hydrophobic polymer (e.g., a polyolefin), a polyamide, a polyester, a polyacryl, polystyrene, a copolymer thereof, or a combination thereof. In an embodiment, the polymer 71 may include, for example, polyethylene ("PE"), polypropylene ("PP"), polyethylene terephthalate ("PET"), polyethylene terephthalate glycol ("PETG"), polyethylene naphthalate ("PEN"), nylon, a copolymer thereof, or a combination thereof, but is not limited thereto.

In one embodiment, for example, the polymer 71 may include at least two of PE, PP and a copolymer of PE and PP ("PE-PP"). In one embodiment, for example, the polymer 71 may include a mixture of the PP and the PE-PP.

In such an embodiment, the PP may have, for example, a melt flow index ("MFI") in a range of about 0.1 grams per ten minutes (g/10 min) to about 5 g/10 min. Herein, the MFI shows the amount of a polymer in a melt state flowing per 10 minutes, and relates to viscosity of the polymer in a melted state. Accordingly, as the MFI is lower, the polymer has higher viscosity, while as the MFI is higher, the polymer has lower viscosity. When the PP has an MFI within the range of about 0.1 g/10 min to about 5 g/10 min, properties of a final product as well as workability may be effectively improved. In one embodiment, for example, the polymer 71 may include the PP having an MFI in a range of about 0.5 g/10 min to about 5 g/10 min.

In such an embodiment, the PE-PP may include an ethylene group in an amount of about 1 weight percent (wt %) to about 50 wt % based on the total amount of the copolymer. When the PE-PP includes the ethylene group in the amount of about 1 wt % to about 50 wt %, phase separation of the PP and the PE-PP may be effectively prevented or suppressed, and the PE-PP may have an improved elongation rate during a elongation process as well as have high light transmittance and alignment, thereby improving polarization characteristics. In one embodiment, for example, the polymer 71 may include the PE-PP including an ethylene group in an amount of about 1 wt % to about 25 wt % based on the total amount of the copolymer.

In such an embodiment, the PE-PP may have an MFI in a range of about 5 g/10 min to about 15 g/10 min. When the PE-PP has an MFI in the range of about 5 g/10 min to about 15 g/10 min, properties of a final product as well as workability may be effectively improved. In one embodiment, for example, the polymer 71 may include the PE-PP having an MFI in a range of about 10 g/10 min to about 15 g/10 min.

In such an embodiment, the polymer 71 may include the PP and the PE-PP in a weight ratio of about 1:9 to about 9:1. When the PP and the PE-PP of the polymer 71 are in the ratio of about 1:9 to about 9:1, the PP may be effectively prevented from crystallizing and may have high mechanical strength, thus substantially improving the haze characteristics. In one embodiment, for example, the polymer 71 may include the PP and the PE-PP in a weight ratio in a range of about 4:6 to about 6:4. In one embodiment, for example, the polymer 71 may include the PP and the PE-PP in a weight ratio of about 5:5.

In such an embodiment, the polymer 71 may have an MFI in a range of about 1 g/10 min to about 15 g/10 min. When the polymer 71 has an MFI in the range of about 1 g/10 min to about 15 g/10 min, the polyolefin resin may have a high light transmittance by effectively preventing crystals from being excessively formed in the resin, and may have appropriate viscosity for manufacturing a film and thus have improved workability. In one embodiment, for example, the polymer 71 may have an MFI in a range of about 5 g/10 min to about 15 g/10 min.

In such an embodiment, the polymer 71 may have haze of less than or equal to about 5%. When the polymer 71 has haze of less than or equal to about 5%, transmittance may be increased, and have high optical properties. In an embodiment, the polymer 71 may have haze of less than or equal to about 2%. In one embodiment, for example, the polymer 71 may have haze in a range of about 0.5% to about 2%.

In such an embodiment, the polymer 71 may have crystallinity of less than or equal to about 50%. When the polymer 71 has crystallinity of less than or equal to about 50%, the polymer 71 may have lower haze and high optical properties. In one embodiment, for example, the polymer 71 may have crystallinity in a range of about 30% to about 50%.

In such an embodiment, the dichroic dye 72 may be dispersed in the polymer 71, and arranged substantially in a predetermined direction along the elongation direction of the polymer 71. The dichroic dye 72 may have a longitudinal shape, for example, a rod shape, that is long in one direction. The dichroic dye 72 may transmit one polarizing perpendicular component out of two polarizing perpendicular components (e.g., one of two linearly polarized perpendicular components of light) in a predetermined wavelength region.

The dichroic dye 72 may have a maximum absorption wavelength ($\lambda_{max}$) in a visible ray region, for example, one or more maximum absorption wavelength ($\lambda_{max}$) in a range from about 380 nanometers (nm) to about 780 nm.

The decomposition temperature of the dichroic dye 72 may be greater than or equal to about 245° C. Herein, the decomposition temperature indicates a temperature where the weight of the dichroic dye 72 decreases by about 5% relative to its initial weight.

The dichroic dye 72 may be included in an amount of about 0.01 part by weight to about 5 parts by weight based on 100 parts by weight of the polymer 71. When the dichroic dye 72 in the polarization layer 70 is in such an amount, the polarization layer 70 may have effective polarization characteristics without deteriorating transmittance thereof. In one embodiment, for example, the dichroic dye 72 in the polarization layer 70 may be included in an amount of about 0.05 part by weight to about 1 part by weight based on 100 parts by weight of the polymer 71 in the polarization layer 70.

In an embodiment, the polarization layer 70 may be a melt-blend of the polymer 71 and the dichroic dye 72. The melt-blend may be obtained by melt-blending the composition for a polarization layer including the polymer 71 and the dichroic dye 72 at a temperature of greater than or equal to the melting point of the polymer 71.

A composition for manufacturing a polarization layer may include the polymer 71 and the dichroic dye 72 as described above, and the polymer 71 and the dichroic dye 72 may be in a form of a solid such as a powder. The composition for a polarization layer may have, for example, a solid content of greater than or equal to about 90 wt %. In such an embodiment, the composition for a polarization layer may not include a solvent.

The polarization layer 70 may be, for example, manufactured by melt-blending and elongating the composition for a polarization layer and putting the melt-blended composition into a mold, pressing the melt-blended composition into a sheet, and elongating the sheet in a predetermined direction, e.g., a uniaxial direction.

The melt-blending of the composition for a polarization layer may be performed at a temperature of less than or equal to about 300° C., for example, in a range of about 50° C. to about 300° C.

The sheet may be formed by putting the melt-blended composition in the mold, and pressing the melt-blended composition with a high pressure or discharging the melt-blended composition in a chill roll through a T-die.

The elongation in the uniaxial direction may be performed at a temperature in a range of about 30° C. to about 200° C. at an elongation rate in a range of about 400% to about 1000%. The elongation rate refers to a length ratio of a sheet after the elongation to before the elongation of the sheet, and means the elongation extent of the sheet after the elongation, e.g., a uniaxial elongation.

The elongation direction may be substantially parallel to a longitudinal direction of the dichroic dye 72.

The polarization layer 70 may have a relatively thin thickness of less than or equal to about 100 micrometers (μm), for example, a thickness in a range of about 30 μm to about 95 μm. When the polarization layer 70 has a thickness in such a range, the polarization layer 70 may be significantly thinner than a conventional polarizing plate including a protective layer such as triacetyl cellulose ("TAC"), such that a display device including the polarization layer 70 may have a thin thickness.

Hereinafter, the protective layer 80a or 80b will be described in greater detail.

In an embodiment, as shown in FIG. 1, the protective layer 80a or 80b may be positioned on a surface or opposing surfaces of the polarization layer 70 to protect the polarization layer 70.

In an embodiment, the protective layer 80a or 80b may have a cross-linking structure. In such an embodiment, the protective layer 80a or 80b may include cross-linked material, in which a plurality of polymer chains spread in a first direction cross a plurality of polymer chains spread in a second direction crossing the first direction. In such an embodiment, the cross-linking structure may include, for example, a net-like or network structure defined by a cross-linked polymer networks. In such an embodiment, the cross-linking structure stores the dichroic dye 72 in the polarization layer 70 by blocking or preventing the dichroic dye 72 in the polarization layer 70 from migrating outside of the polarization layer 70, and thus may effectively prevent property deterioration of the polarization film by decreasing the loss of the dichroic dye 72.

The dichroic dye 72 may be lost particularly during a subsequent high temperature process and/or when allowed to stand at a high temperature. In an embodiment, the loss of the dichroic dye 72 may be decreased by the cross-linking structure such that a variation ratio of light transmittance (ΔT) may be decreased to be less than or equal to about 0.5%, a variation ratio of a degree of polarization (ΔPE) may be decreased to be less than or equal to about 3%, and a variation ratio of a dichroic ratio (ΔDR) may be decreased to be less than or equal to about 0.5 when allowed to stand at about 80° C. for about 500 hours. Accordingly, an embodiment of the polarization film may be effectively prevented from degrading optical properties during a subsequent high temperature process and/or when allowed to stand at a high temperature, and thus increase reliability.

The protective layer 80a or 80b may be disposed on a surface or opposing surfaces of the polarization layer 70 and cover the surface of the polarization layer 70, and thus may effectively prevent the polarization layer 70 from being scratched on the surface and increase hardness of the polarization film.

In such an embodiment, where the protective layer 80a or 80b having the cross-linking structure is disposed on a surface or opposing surfaces of the polarization layer 70 and fixes the relatively thin and highly elongated polarization layer 70, and thus may effectively prevent the polarization layer 70 from having thermal shrinkage in a high temperature process and thus from being bent or transformed.

The cross-linking structure may be, for example, formed through photo-curing and/or thermal curing, for example, by curing a composition including a photocurable monomer, a photocurable oligomer, a thermosetting resin, or a combination thereof.

The photocurable monomer or the photocurable oligomer may be any compound capable of forming the cross-linking structure through the photo-curing, for example, a urethane acrylate monomer, a urethane acrylate oligomer, an epoxy acrylate monomer, an epoxy acrylate oligomer, a polyether acrylate monomer, a polyether acrylate oligomer, a polyester acrylate monomer, a polyester acrylate oligomer, or a combination thereof, but not being limited thereto.

The composition may include, for example, about 5 wt % to about 60 wt % of the photocurable monomer or the photocurable oligomer, about 0.01 wt % to about 5 wt % of a photoinitiator, and a balance of a solvent. The composition may include, for example, an additive.

The thermosetting resin may be any compound capable of forming the cross-linking structure through the thermal curing, for example, a melamine resin, a urethane resin, an epoxy resin, or a combination thereof, but not being limited thereto.

The composition may include, for example, about 15 wt % to about 74 wt % of the thermosetting resin, about 0.1 wt % to about 10 wt % of a curing agent, and a balance of a solvent. The composition may include, for example, an additive.

In an embodiment, the protective layer 80a or 80b may have a thickness less than or equal to about 10 μm. In one embodiment, for example, the protective layer 80a or 80b may have a thickness in a range of about 0.1 μm to 5 μm. In an embodiment, the polarization film 50 may include a single protective layer disposed on one surface of the polarization layer 70.

The protective layer 80a or 80b may be formed, for example, through a deposition process or a solution process.

Hereinafter, an embodiment of an antireflection film including the polarization film will be described in detail.

Figure 3:
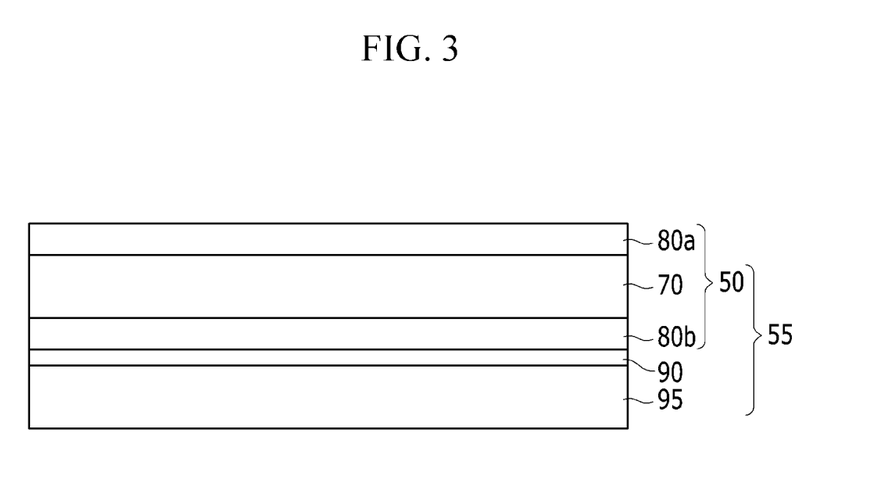
FIG. 3 is a cross-sectional view showing an embodiment of an antireflection film according to one embodiment.

FIG. 3 is a cross-sectional view showing an embodiment of an antireflection film according to one embodiment.

An embodiment of an antireflection film 55 includes an polarization film 50, a phase difference film 95 positioned on one side of the polarization film 50, and an adhesion layer 90 interposed between the polarization film 50 and the phase difference film 95. In such an embodiment, the polarization film 50 may be substantially the same as embodiments of the polarization film 50 described above with reference to FIGS. 1 and 2.

The polarization film 50 includes the polarization layer 70 including the polymer and the dichroic dye, and a protective layer, e.g., a plurality of protective layers 80a and 80b, disposed on a surface (e.g., one of opposing surfaces or both of opposite surfaces) of the polarization layer 70 and having a cross-linking structure. The polarization film 50 shown in FIG. 3 is the same as an embodiment of the polarization film described above, and any repetitive detailed description thereof will be omitted.

In such an embodiment, the phase difference film 95 may be, for example, a λ/4 plate, and may change, for example, linear polarized light into circular polarized light.

In such an embodiment, the adhesion layer 90 may include, for example, a pressure sensitive sticking agent or an adhesive. In an alternative embodiment, the adhesion layer 90 may be omitted.

The antireflection film 55 may be disposed on a surface or both surfaces of a display device, and particularly, on a surface at a screen side of the display, and thus may effectively prevent reflection of light from the outside (hereinafter referred to as "external light"). Accordingly, visibility deterioration of the display device due to reflection of external light may be effectively prevented.

Figure 4:
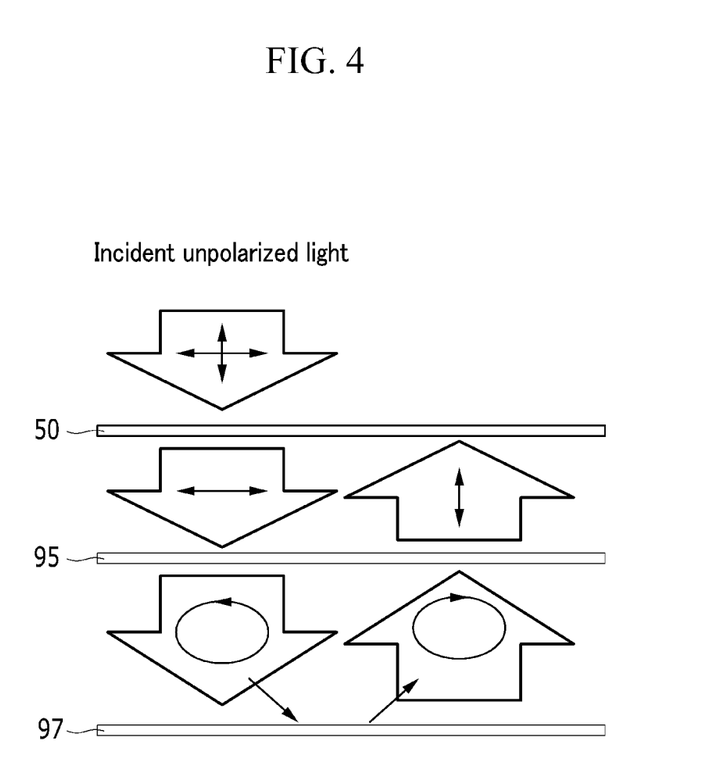
FIG. 4 is a schematic view showing a mechanism for preventing reflection of external light of an embodiment of an antireflection film according to one embodiment.

FIG. 4 is a schematic view showing a mechanism for preventing reflection of external light of an embodiment of an antireflection film according to one embodiment.

Referring to FIG. 4, when the incident unpolarized light from the outside, e.g., the external light, is passed through the polarization film 50, only a first polarized perpendicular component, which is one polarized perpendicular component of two polarized perpendicular components, is transmitted through the polarization film 50, thereby changed to a polarized light. The polarized light is shifted into a circularly polarized light by passing through the phase difference film 95 such as the λ/4 plate. When the circularly polarized light in a first circular polarization direction is reflected in a display panel 97 including a substrate, an electrode, and so on, and changes to the circularly polarized light in a second circular polarization direction, which is opposite to the first circular polarization direction, and the circularly polarized light in the second circular polarization direction is passed through the phase difference film 95 again, only a second polarized perpendicular component, which is the other polarized perpendicular component of the two polarized perpendicular components, may be transmitted through the phase difference film 95. As the second polarized perpendicular component is blocked by the polarization film 50, and the external light passed and reflected through antireflection film to the outside does not exit to the outside, thereby effectively preventing the external light reflection. Such an embodiment of the polarization film or the antireflection film may be applied to a display device.

In one embodiment, for example, the display device may be a liquid crystal display ("LCD").

Figure 5:
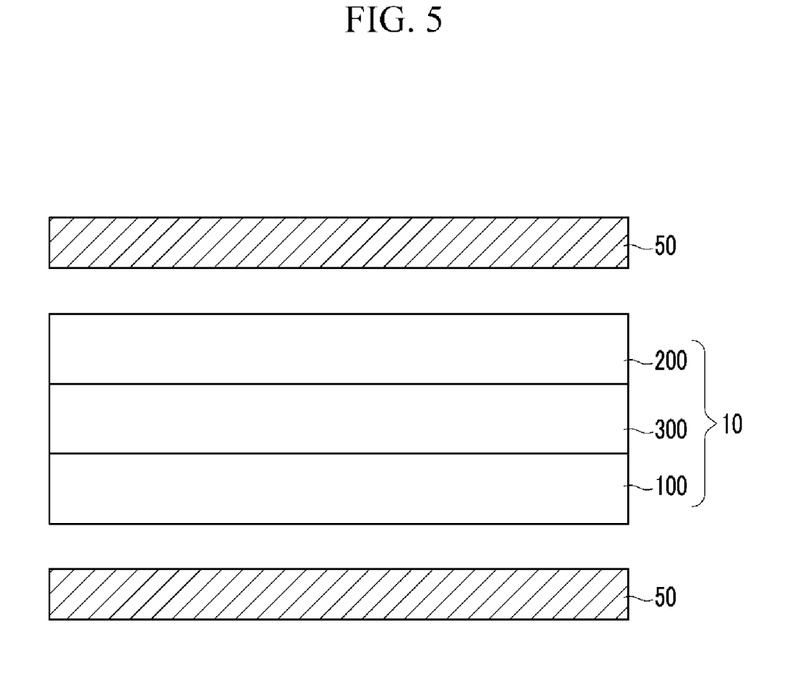
FIG. 5 is a cross-sectional view showing an embodiment of a liquid crystal display ("LCD") according to one embodiment.

FIG. 5 is a cross-sectional view showing an embodiment of an LCD according to one embodiment.

Referring to FIG. 5, the LCD includes a liquid crystal display panel 10, and a polarization film 50 disposed on opposing surface of the liquid crystal panel 10, e.g., on a lower surface and an upper surface of the liquid crystal display panel 10.

The liquid crystal display panel 10 may be a twist nematic ("TN") mode panel, a patterned vertical alignment ("PVA") mode panel, an in-plane switching ("IPS") mode panel, an optically compensated bend ("OCB") mode panel, or the like.

In an embodiment, the liquid crystal display panel 10 includes a first display plate 100 (e.g., a lower panel), a second display plate 200 disposed opposite to the first display plate 100 (e.g., an upper panel), and a liquid crystal layer 300 interposed between the first display plate 100 and the second display plate 200.

In one embodiment, for example, the first display plate 100 may include a thin film transistor (not shown) disposed on a substrate (not shown), and a first electric field generating electrode (not shown) connected to the thin film transistor. The second display plate 200 may include, for example, a color filter (not shown) disposed on the substrate, and a second electric field generating electrode (not shown), but not being limited thereto. In an alternative embodiment, the color filter may be included in the first display plate 100, and both the first electric field generating electrode and the second electric field generating electrode may be disposed in the first display plate 100.

The liquid crystal layer 300 may include a plurality of liquid crystal molecules. The liquid crystal molecules may have positive or negative dielectric anisotropy. In an embodiment, where the liquid crystal molecules have positive dielectric anisotropy, the longitudinal axis of the liquid crystal molecules may be aligned substantially parallel to the surface of the first display plate 100 and the second display plate 200 when no electric field is generated therein, and may be aligned substantially perpendicular to the surface of the first display plate 100 and the second display plate 200 when an electric field is generated therein. In an alternative embodiment, where the liquid crystal molecules have negative dielectric anisotropy, the longitudinal axis of the liquid crystal molecules may be aligned substantially perpendicular to the surface of the first display plate 100 and the second display plate 200 when no electric field is generated therein, and may be aligned substantially parallel to the surface of the first display plate 100 and the second display plate 200 when an electric field is generated therein.

The polarization film 50 is disposed on a surface (e.g., an external surface) of the liquid crystal display panel 10. In an embodiment, as shown in FIG. 5, the polarization film 50 may be disposed on upper and lower surfaces of the liquid crystal display panel 10. In an alternative embodiment, the polarization film 50 may be disposed on either the upper surface or the lower surface of the liquid crystal display panel 10.

In an embodiment, the polarization film 50 includes the polarization layer 70 including the polymer and the dichroic dye, and a protective layer 80a or 80b disposed on a surface (e.g., one of opposing surfaces or both of opposite surfaces) of the polarization layer 70. In such an embodiment, the polarization film 50 shown in FIG. 5 is substantially the same as an embodiment of the polarization film described above, and any repetitive detailed description thereof will be omitted.

In an embodiment, the display device may be an organic light emitting diode ("OLED") display.

Figure 6:
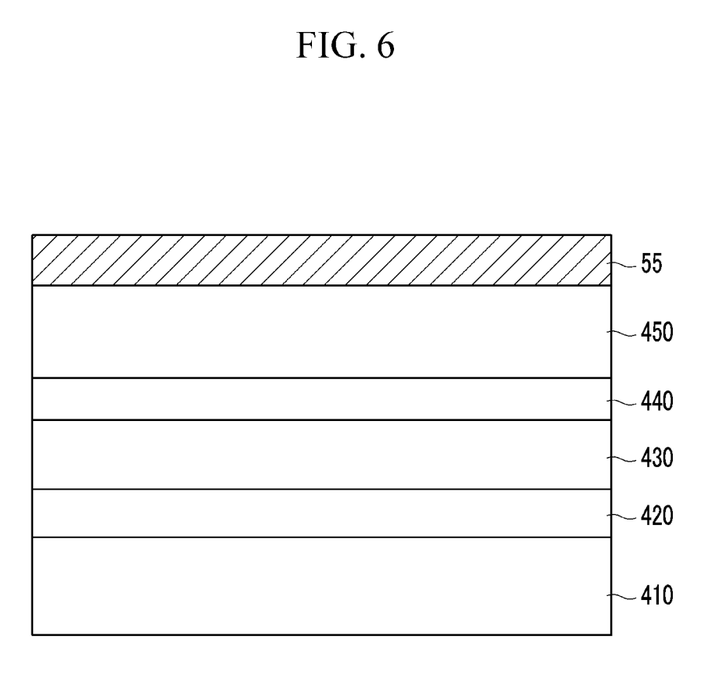
FIG. 6 is a cross-sectional view showing an embodiment of an organic light emitting diode ("OLED") display according to one embodiment.

FIG. 6 is a cross-sectional view showing an embodiment of an OLED display according to one embodiment.

Referring to FIG. 6, an embodiment of an OLED display includes a base substrate 410, a lower electrode 420, an organic emission layer 430, an upper electrode 440, an encapsulation substrate 450, and an anti reflection film 55.

The base substrate 410 may include or be formed of glass or plastic, for example.

One of the lower electrode 420 and the upper electrode 440 may be an anode, and the other of the lower electrode 420 and the upper electrode 440 may be a cathode. The anode is an electrode where holes are injected, and is formed of a transparent conductive material having a high work function and externally transmitting entered light, for example, indium tin oxide ("ITO") or indium zinc oxide ("IZO"). The cathode is an electrode where electrons are injected, is formed of a conducting material having a low work function and having no influence on an organic material, and includes at least one selected from, for example, aluminum (Al), calcium (Ca) and barium (Ba).

The organic emission layer 430 includes an organic material that emits light when a voltage is applied between the lower electrode 420 and the upper electrode 440.

In such an embodiment, an auxiliary layer (not shown) may be included between the lower electrode 420 and the organic emission layer 430 and between the upper electrode 440 and the organic emission layer 430. The auxiliary layer may include a hole transport layer for balancing electrons and holes, a hole injection layer ("HIL"), an electron injection layer ("EIL"), and an electron transport layer.

The encapsulation substrate 450 may include or be made of glass, metal or a polymer, for example. The encapsulation substrate 450 may seal the lower electrode 420, the organic emission layer 430 and the upper electrode 440 to prevent moisture and/or oxygen from flowing therein.

The antireflection film 55 includes a phase difference film 95 and a polarization film 50 shown in FIG. 3. The phase difference film 95 may circularly polarize light passed through the polarization film 50 and generate a phase difference, and thus has an influence on reflection and absorption of the light. The polarization film 50 includes the polarization layer 70 including the polymer and the dichroic dye, and the protective layer 80a or 80b disposed on a surface of the polarization layer 70, which is substantially the same as those in the embodiments described above.

The antireflection film 55 may be disposed at a light-emitting side. In one exemplary embodiment, for example, the antireflection film 55 may be disposed outside of the base substrate 410 of an OLED display in a bottom emission type in which light emits from the base substrate 410. In one exemplary embodiment, for example, the antireflection film 55 may be disposed outside of the encapsulation substrate 450 of an OLED display in a top emission type in which light emits from the encapsulation substrate 450.

Hereinafter, embodiments will be described in greater detail with reference to examples. However, these examples are only exemplary, and the invention is not limited thereto.

Preparation of Polarization Layer

A composition for a polarization film is prepared by mixing PP and a PP-PE in a ratio of about 5:5 (w/w) to obtain a polymer and adding each dichroic dye represented by the following Chemical Formulas A, B and C, respectively, in amounts of 0.5, 0.2 and 0.3 parts by weight, based on 100 parts by weight of the polymer.

(e.g., a first surface) of the polarization layer using a doctor blade. Subsequently, the polarization layer coated with the composition is dried at 85° C. for 5 minutes by radiating a metal halide lamp at 400 millijoules per square centimeter (mJ/cm$^2$) thereto to form an about 5 µm-thick protective layer. The composition for a protective layer (CHSR33, CC Tech Inc.) is then coated on another surface (e.g., a second surface opposite to the first surface) of the polarization layer in the same method as above, and then dried and cured to form an about 5 µm-thick protective layer, resultantly manufacturing a polarization film.

Example 2

A polarization film is manufactured by substantially the same method as Example 1, except for using CHSR35 (CC Tech Inc.) instead of the CHSR33 (CC Tech Inc.) as the composition for a protective layer to form a protective layer on both surfaces of a polarization layer.

Comparative Example 1

A polarization film is manufactured by using a polarization layer without forming a protective layer.

Evaluation

Evaluation 1

Surface hardness of the polarization films according to Examples 1 and 2 and Comparative Example 1 is evaluated.

The surface hardness is evaluated by using a pencil hardness-measuring instrument (CT-PC1, KOA Tech Ltd.).

The results are provided in Table 1.

Chemical Formula A

Chemical Formula B

Chemical Formula C

The composition for a polarization film is melt-blended at about 250° C. with a micro-compounder made by DSM Co. The melt-blend is put in a sheet-shaped mold and pressed at a high temperature with a high pressure, manufacturing a film. Subsequently, the film is about 1,000% elongated in a predetermined direction (e.g., uniaxial direction with a tensile tester made by Instron Inc.) at 115° C., thereby manufacturing a polarization layer.

Manufacture of Polarization Film

Example 1

Both sides of the above polarization layer are respectively corona-treated (250 doses), and a composition for a protective layer (CHSR33, CC Tech Inc.) is coated on a surface

TABLE 1

|  | Surface hardness |
| --- | --- |
| Example 1 | 2H |
| Example 2 | 2H |
| Comparative Example 1 | Non-measurable (lower than F) |

Referring to Table 1, the polarization films according to Examples 1 and 2 show higher surface hardness than the polarization film according to Comparative Example 1.

Evaluation 2

Each antireflection film is manufactured by sequentially attaching a phase difference film (WRS, Teijin Ltd.) and a glass substrate on one side of the polarization films according to Examples 1 and 2 and Comparative Example 1 with a pressure sensitive adhesive (PS-47, Soken Chemical & Engineering Co., Ltd.). The antireflection film is manufactured by sequentially stacking the glass substrate, the pressure sensitive adhesive, the phase difference film, the pressure sensitive adhesive, and the polarization film.

Then, light transmittance, a degree of polarization and dichroic ratio ("DR") of the antireflection film are evaluated, and then reevaluated after the antireflection film is allowed to stand at 85° C. for 500 hours.

The light transmittance is evaluated by using a V-7100 UV/Vis spectrophotometer (JASCO).

The light transmittance measurement is used to calculate the DR and a degree of polarization, that is, polarizing efficiency ("PE").

The DR is obtained by the following Equation 1.

$$DR = \text{Log}(1/T_\perp)/\text{Log}(1/T_\parallel)$$

In the Equation 1, DR denotes a dichroic ratio of an antireflection film, $T_\parallel$ denotes light transmittance of a polarization film of the antireflection film regarding light entering parallel to the transmissive axis, and $T_\perp$ denotes light transmittance of the polarization film of the antireflection film regarding light entering perpendicular to the transmissive axis.

The dichroic ratio relates to a degree of alignment of the dichroic dye with respect to a predetermined direction in the polarizing film 70.

The degree of polarization is obtained by the following Equation 2.

$$PE(\%) = [(T_\parallel - T_\perp)/(T_\parallel + T_\perp)]^{1/2} \times 100 \qquad \text{Equation 2:}$$

In the Equation 2, PE denotes a degree of polarization of an antireflection film, $T_\parallel$ denotes transmittance of a polarization film of the antireflection film regarding light entering parallel to the transmissive axis, and $T_\perp$ denotes transmittance of the polarization film of the antireflection film regarding light entering perpendicular to the transmissive axis.

The results are provided in Tables 2 to 4.

TABLE 2

| | λ (380-780 nm) | Variation of light transmittance (%) (ΔTS) |
|---|---|---|
| Example 1 | 550 | 0.37 |
| Example 2 | 550 | 0.32 |
| Comparative Example 1 | 550 | 6.56 |

TABLE 3

| | λ (380-780 nm) | Variation of degree of polarization (ΔPE) |
|---|---|---|
| Example 1 | 550 | 0.38 |
| Example 2 | 550 | 0.33 |
| Comparative Example 1 | 550 | 3.75 |

TABLE 4

| | λ (380-780 nm) | Variation of dichroic ratio (ΔDR) |
|---|---|---|
| Example 1 | 550 | 0.11 |
| Example 2 | 550 | 0.09 |

TABLE 4-continued

| | λ (380-780 nm) | Variation of dichroic ratio (ΔDR) |
|---|---|---|
| Comparative Example 1 | 550 | 1.11 |

Referring to Tables 2 to 4, the antireflection films manufactured using the polarization films according to Examples 1 and 2, respectively, show substantially decreased light transmittance, degree of polarization, and dichroic ratio compared with the antireflection film manufactured using the polarization film according to Comparative Example 1 after allowed to stand at a high temperature. Accordingly, the antireflection films manufactured using the polarization films according to Examples 1 and 2 show substantially improved thermal durability compared with the antireflection film manufactured using the polarization film according to Comparative Example 1.

Evaluation 3

Thermal stability of the polarization films according to Examples 1 and 2 and Comparative Example 1 is evaluated.

The thermal stability is evaluated by heating the polarization films according to Examples 1 and 2 and Comparative Example 1 up to 85° C. at a speed of 10° C./min and allowing them to stand at 85° C. for 5 hours, and then measuring their length change.

The result is provided in Table 5.

TABLE 5

| | Length shrinkage of polarization film (μm) |
|---|---|
| Example 1 | −34.5 |
| Example 2 | −38.1 |
| Comparative Example 1 | −305.4 |

Referring to Table 5, the polarization films according to Examples 1 and 2 show a substantially reduced thermal shrinkage rate compared with the polarization film according to Comparative Example 1.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A polarization film comprising:
a polarization layer comprising a melt-blend of a hydrophobic polymer and a dichroic dye,
the melt-blend being a product obtained by melting the hydrophobic polymer and the dichroic dye at a temperature of greater than or equal to the melting point of the hydrophobic polymer without a solvent,
the hydrophobic polymer comprising a polyolefin, a polyamide, a polyester, a polyacryl, polystyrene, a copolymer thereof, or a combination thereof, and
the dichroic dye having a maximum absorption wavelength in a range of about 380 nanometers to about 780 nanometers; and
protective layers disposed on both of opposite surfaces of the polarization layer, the protective layers having a cross-linking structure.

2. The polarization film of claim 1, wherein the cross-linking structure of the protective layer blocks the dichroic dye from migrating outside of the polarization layer.

3. The polarization film of claim 1, wherein the protective layer comprises a material having the cross-linking structure obtained by curing a photocurable monomer, a photocurable oligomer, a thermosetting resin, or a combination thereof.

4. The polarization film of claim 3, wherein the photocurable monomer or the photocurable oligomer comprises a urethane acrylate monomer, a urethane acrylate oligomer, an epoxy acrylate monomer, an epoxy acrylate oligomer, a polyether acrylate monomer, a polyether acrylate oligomer, a polyester acrylate monomer, a polyester acrylate oligomer, or a combination thereof.

5. The polarization film of claim 4, wherein the material having the cross-linking structure is obtained from a composition including about 5 wt % to about 60 wt % of the photocurable monomer or the photocurable oligomer, about 0.01 wt % to about 5 wt % of a photoinitiator, and a balance of a solvent.

6. The polarization film of claim 3, wherein the thermosetting resin comprises a melamine resin, a urethane resin, an epoxy resin, or a combination thereof.

7. The polarization film of claim 6, wherein the material having the cross-linking structure is obtained from a composition including about 15 wt % to about 74 wt % of the thermosetting resin, about 0.1 wt % to about 10 wt % of a curing agent, and a balance of a solvent.

8. The polarization film of claim 1, wherein the hydrophobic polymer comprises polyethylene, polypropylene, polyethylene terephthalate, polyethylene terephthalate glycol, polyethylene naphthalate, nylon, a copolymer thereof, or a combination thereof.

9. The polarization film of claim 1, wherein the polarization film has a variation ratio of light transmittance ($\Delta T$) of less than or equal to about 0.5% when allowed to stand at about 80° C. for about 500 hours.

10. The polarization film of claim 1, wherein the polarization film has a variation ratio of a degree of polarization ($\Delta PE$) of less than or equal to about 3% when allowed to stand at about 80° C. for about 500 hours.

11. The polarization film of claim 1, wherein the polarization film has a variation ratio of a dichroic ratio ($\Delta DR$) of less than or equal to about 0.5 when allowed to stand at about 80° C. for about 500 hours.

12. The polarization film of claim 1, wherein the protective layer has a thickness of less than or equal to about 10 micrometers.

13. The polarization film of claim 12, wherein the protective layer has a thickness of about 0.1 micrometer to about 5 micrometers.

14. The polarization film of claim 1, wherein
the dichroic dye is dispersed in the polymer, and
the polymer is elongated at about 400% to about 1000% in a predetermined direction.

15. An antireflection film comprising
the polarization film of claim 1, and
a phase difference film disposed on a surface of the polarization film.

16. A display device comprising the polarization film of claim 1.

17. An organic light emitting diode device comprising
a first electrode and a second electrode facing each other,
an emission layer disposed between the first electrode and the second electrode, and
a polarization film disposed on the first electrode or the second electrode and including a polarization layer and a protective layer,
wherein the polarization film comprises
a polarization layer comprising a melt-blend of a hydrophobic a polymer and a dichroic dye having a maximum absorption wavelength in a range of about 380 nanometers to about 780 nanometers, the melt-blend being a product obtained by melting the hydrophobic polymer and the dichroic dye at a temperature of greater than or equal to the melting point of the hydrophobic polymer without a solvent, and the hydrophobic polymer comprising a polyolefin, a polyamide, a polyester, a polyacryl, polystyrene, a copolymer thereof, or a combination thereof, and
protective layers disposed on both of opposite surfaces of the polarization layer, the protective layers having a cross-linking structure.

18. The organic light emitting diode device of claim 17, further comprising a phase difference film disposed on a surface of the polarization film.

19. The organic light emitting diode device of claim 17, wherein the cross-linking structure of the protective layer blocks the dichroic dye from migrating outside of the polarization layer.

20. The organic light emitting diode device of claim 17, wherein the protective layer comprises a material having the cross-linking structure obtained by curing a photocurable monomer, a photocurable oligomer, a thermosetting resin, or a combination thereof.

21. The organic light emitting diode device of claim 20, wherein the photocurable monomer or the photocurable oligomer comprises a urethane acrylate monomer, a urethane acrylate oligomer, an epoxy acrylate monomer, an epoxy acrylate oligomer, a polyether acrylate monomer, a polyether acrylate oligomer, a polyester acrylate monomer, a polyester acrylate oligomer, or a combination thereof.

22. The organic light emitting diode device of claim 21, wherein the material having the cross-linking structure is obtained from a composition including about 5 wt % to about 60 wt % of the photocurable monomer or the photocurable oligomer, about 0.01 wt % to about 5 wt % of a photoinitiator, and a balance of a solvent.

23. The organic light emitting diode device of claim 20, wherein the thermosetting resin comprises a melamine resin, a urethane resin, an epoxy resin, or a combination thereof.

24. The organic light emitting diode device of claim 23, wherein the material having the cross-linking structure is obtained from a composition including about 15 wt % to about 74 wt % of the thermosetting resin, about 0.1 wt % to about 10 wt % of a curing agent, and a balance of a solvent.

* * * * *